United States Patent
Jhang et al.

(10) Patent No.: US 12,500,407 B2
(45) Date of Patent: Dec. 16, 2025

(54) CLAMPING CIRCUIT

(71) Applicant: INDUSTRIAL TECHNOLOGY RESEARCH INSTITUTE, Hsinchu (TW)

(72) Inventors: Jia-Yao Jhang, Taoyuan (TW); Chiu-Pao Tien, Zhubei (TW); Hsi-Chih Chang, Hsinchu (TW); Cheng-Min Chang, Keelung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 134 days.

(21) Appl. No.: 18/396,541

(22) Filed: Dec. 26, 2023

(65) Prior Publication Data

US 2025/0210976 A1  Jun. 26, 2025

(51) Int. Cl.
  *H02H 9/04* (2006.01)
(52) U.S. Cl.
  CPC ...................... *H02H 9/04* (2013.01)
(58) Field of Classification Search
  CPC ........................................... H02H 9/04
  USPC ........................................... 361/91.1
  See application file for complete search history.

(56) References Cited

U.S. PATENT DOCUMENTS

| 8,310,796 B2 * | 11/2012 | Wagoner | H03F 1/302 |
| | | | 361/103 |
| 8,982,518 B2 | 3/2015 | Shi | |
| 9,509,299 B2 * | 11/2016 | Mathieu | H03K 17/166 |
| 10,306,717 B1 | 5/2019 | Yau et al. | |
| 10,367,496 B2 * | 7/2019 | Ying | H03K 17/08128 |
| 2013/0082762 A1 | 4/2013 | Gan et al. | |
| 2019/0280687 A1* | 9/2019 | Ying | H03K 17/08128 |

(Continued)

FOREIGN PATENT DOCUMENTS

| CN | 104052048 A | 9/2014 |
| CN | 207166472 U | 3/2018 |
| CN | 209046518 U | 6/2019 |

(Continued)

OTHER PUBLICATIONS

Liu, Min-tong; Title: Switch tube control device and switch tube device; Entire specification and drawings (Year: 2021).*

(Continued)

*Primary Examiner* — Dharti H Patel
(74) *Attorney, Agent, or Firm* — Maschoff Brennan (57) ABSTRACT

A clamping circuit includes an insulated-gate bipolar transistor (IGBT), a transient-voltage-suppression (TVS) diode module, an isolated driving unit, a first independent power source and a first current limiting resistor. A second terminal of the TVS diode module is connected to a collector of the IGBT. A primary side of the isolated driving unit is connected to a first terminal of the TVS diode module, and a first terminal of a secondary side of the isolated driving unit is configured to receive a power voltage. The first independent power source is configured to provide the power voltage to the first terminal of the secondary side of the isolated driving unit. A terminal of the first current limiting resistor is connected to a second terminal of the secondary side of the isolated driving unit, and the other terminal of the first current limiting resistor is connected to a gate of the IGBT.

8 Claims, 7 Drawing Sheets

(56) References Cited

U.S. PATENT DOCUMENTS

2025/0210976 A1* 6/2025 Jhang .................. H02H 9/04

FOREIGN PATENT DOCUMENTS

| | | | | |
|---|---|---|---|---|
| CN | 110784953 | A | | 2/2020 |
| CN | 108471304 | B | * 5/2020 | ......... H03K 17/0828 |
| CN | 211981740 | U | | 11/2020 |
| CN | 112769422 | A | * 5/2021 | ............. H03K 17/16 |
| CN | 113595541 | A | * 11/2021 | ........... H03K 17/567 |
| CN | 115036888 | A | | 9/2022 |
| CN | 114977753 | A | | 11/2022 |
| CN | 220457387 | U | * 2/2024 | |
| DE | 10149777 | A1 | * 4/2003 | ........... H10D 12/441 |
| EP | 4344065 | A1 | * 3/2024 | ......... H03K 17/0822 |
| JP | 2023023630 | A | | 2/2023 |
| TW | M245666 | U | | 10/2004 |
| TW | 201315145 | A | | 4/2013 |
| TW | 201436404 | A | | 9/2014 |
| TW | I472154 | B | | 2/2015 |
| TW | 201944848 | A | | 11/2019 |
| WO | WO-2013102778 | A1 | * 7/2013 | ........... H03K 17/166 |

OTHER PUBLICATIONS

Shan L; Title: Switch circuit has first terminal . . . , and second end of second transistor; entire specification and drawings (Year: 2021).*

Du, Lingzhi et al., "A New IGBT Over-Voltage and Over-Current Protection Method Based on Active Clamp Technology", 2021 22nd International Vacuum Electronics Conference (IVEC), Rotterdam, Netherlands, 2021.

Fan, Romeo et al., "Active clamp for Gate driver", Power electronics, 2019.

Lu, Ting et al., "Active clamping circuit with status feedback for HV-IGBT", 15th International Conference on Electrical Machines and Systems (ICEMS), Sapporo, Japan,2012.

Katoh, S., "Active-gate-control for snubberless IGBTs connected in series," 2002 IEEE 33rd Annual IEEE Power Electronics Specialists Conference., vol. 2, 2002.

Littelfuse, "Active clamping of IGBT utilizing high voltage TVS diode" EE Times Dec. 23, 2023.

Power Electronics Europe, "Advantages of Advanced Active Clamping ", IGBT Drivers, issue No. 8, 2009.

TW Office Action dated Apr. 10, 2025 as received in Application No. 113100263.

* cited by examiner

CLAMPING CIRCUIT

BACKGROUND

1. Technical Field

This disclosure relates to a clamping circuit, especially to a clamping circuit including an isolated driving unit.

2. Related Art

In the application of high-power insulated-gate bipolar transistor, due to the influence of stray inductance, the collector of the insulated-gate bipolar transistor may occasionally experience overvoltage. By adding a transient-voltage-suppression diode and one diode to clamp the voltage, damage to the insulated-gate bipolar transistor when overvoltage occurs may be avoided.

SUMMARY

According to one or more embodiment of this disclosure, a clamping circuit includes: an insulated-gate bipolar transistor (IGBT), a transient-voltage-suppression (TVS) diode module, an isolated driving unit, a first independent power source and a first current limiting resistor. The IGBT has a collector and a gate. The TVS diode module has a first terminal and a second terminal, the second terminal is connected to the collector of the IGBT. The isolated driving unit has a primary side and a secondary side, the primary side is connected to the first terminal of the TVS diode module. The first independent power source is configured to provide a power voltage to a first terminal of the secondary side of the isolated driving unit. A terminal of the first current limiting resistor is connected to a second terminal of the secondary side of the isolated driving unit, the other terminal of the first current limiting resistor is connected to the gate of the IGBT.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
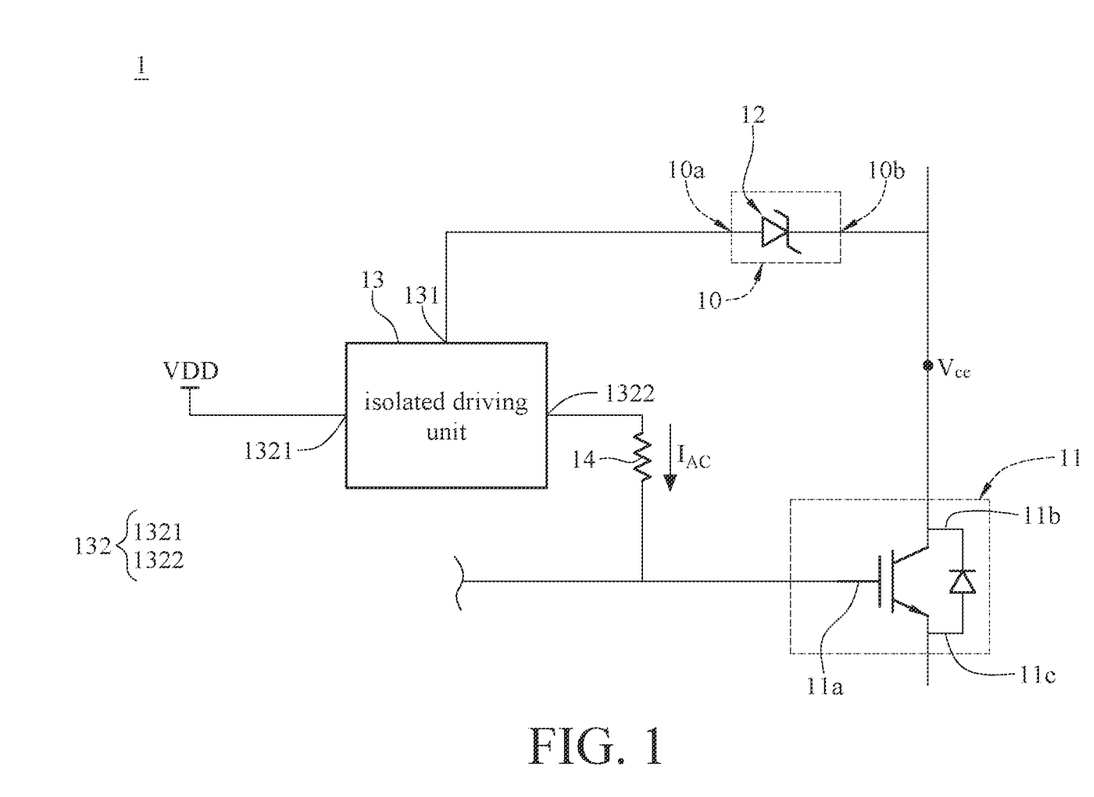
FIG. 1 is a circuit diagram illustrating a clamping circuit according to an embodiment of the present disclosure.

Please refer to FIG. 1, wherein FIG. 1 is a circuit diagram illustrating a clamping circuit according to an embodiment of the present disclosure. As shown in FIG. 1, the clamping circuit 1 includes a transient-voltage-suppression (TVS) diode module 10, an insulated-gate bipolar transistor (IGBT) 11, an isolated driving unit 13, a first current limiting resistor 14 and a first independent power source VDD. Wherein, the IGBT 11 is connected to the TVS diode module 10, the first current limiting resistor 14 and the TVS diode module 10 are connected to the IGBT 11 and the isolated driving unit 13, and the isolated driving unit 13 is connected to the TVS diode module 10, the first independent power source VDD, and the first current limiting resistor 14.

The IGBT 11 includes a gate 11a, a collector 11b and an emitter 11c. The TVS diode module 10 has a first terminal 10a and a second terminal 10b. The TVS diode module 10 includes a transient-voltage-suppression (TVS) diode 12, and in the present embodiment, the first terminal 10a of the TVS diode module 10 may be an anode of the TVS diode 12, and the second terminal 10b may be a cathode of the TVS diode 12. The isolated driving unit 13 has a primary side 131 and a secondary side 132. In the present embodiment, the isolated driving unit 13 may be an optical coupler or an isolated gate driving chip, but the present disclosure is not limited thereto, as long as the isolated driving unit 13 is implemented by an isolated driving unit with isolation and current amplifying functions.

The second terminal 10b of the TVS diode module 10 is connected to the collector 11b of the IGBT 11. The primary side 131 of the isolated driving unit 13 is connected to the first terminal 10a of the TVS diode module 10. A first terminal 1321 of the secondary side 132 of the isolated driving unit 13 is configured to receive a power voltage supplied by the first independent power source VDD. A second terminal 1322 of the secondary side 132 is connected to a terminal of the first current limiting resistor 14, and the other terminal of the first current limiting resistor 14 is connected to the gate 11a of the IGBT 11. The gate 11a of the IGBT 11 may be connected to an external gate driving circuit to receive a driving voltage. In the present embodiment, the power voltage supplied by the first independent power source VDD may be equal to the driving voltage of the gate 11a of the IGBT 11, for example, +15 volts, but the present disclosure is not limited thereto.

Specifically, when the IGBT 11 is turned off, if a voltage Vce across the collector 11b and the emitter 11c of the IGBT 11 is in an overvoltage condition (meaning the voltage Vce exceeds an element threshold of the TVS diode module 10), the TVS diode module 10 is turned on and triggers the secondary side 132 of the isolated driving unit 13 to induce a current on the secondary side 132. Then, the induced current on the secondary side 132 triggers a conduction between the first independent power source VDD and the IGBT 11 to generate a clamping current $I_{AC}$. The clamping current $I_{AC}$ flows into the gate 11a of the IGBT 11 thereby elevating the voltage of the gate 11a. Therefore, the turn-off speed of the IGBT 11 may be slowed down and the overvoltage condition of the collector 11b may be clamped. Then, the IGBT 11 may be completely turned off. Further, by disposing the first current limiting resistor 14 to adjust the clamping current $I_{AC}$, the clamping current $I_{AC}$ may be adjusted for different working conditions, and the power consumption of the TVS diode module 10 is not affected.

Please refer to equation (1) below, wherein $V_{spike}$ is a voltage spike at the moment of the IGBT 11 being turned off, $L_s$ is the stray inductance at the collector 11b side of the IGBT 11, i is a turn-off current of the IGBT 11, and t is the turn-off time (duration) of the IGBT 11. In other words, the clamping current $I_{AC}$ generated by the clamping circuit of the present disclosure may delay the turn-off time t of the IGBT 11, thereby lowering the voltage spike $V_{spike}$ at the moment of the IGBT 11 being turned off. Therefore, the IGBT 11 may be avoided from being damaged by a high voltage spike $V_{spike}$ generated due to the stray inductance.

$$V_{spike} = L_s \times \frac{di}{dt} \quad \text{equation (1)}$$

Please refer to equation (2) below, wherein $T_{off}$ is the time required for the IGBT 11 to be turned off (i.e., the turn-off time t of the IGBT 11), $t_{df}$ is the time required for the voltage of the gate 11a of the IGBT 11 to drop to a threshold voltage, $t_{f1}$ is the duration of the voltage of the gate 11a of the IGBT 11 staying at Miller plateau, and $t_{f2}$ is the time required for the voltage of the gate 11a of the IGBT 11 to drop from the threshold voltage to a default lower limit. Further, a sum of $t_{f1}$ and $t_{f2}$ is the time required for the conduction current of the collector 11b of the IGBT 11 to drop from 90% to 10%.

$$T_{off} = t_{df} + t_{f1} + t_{f2} \quad \text{equation (2)}$$

Therefore, the clamping circuit of the present disclosure may be used to inhibit or alleviate the overvoltage condition of the voltage Vce on the collector 11b and the emitter 11c of the IGBT 11, and may be used to slow down the turn-off speed of the IGBT 11.

Figure 2:
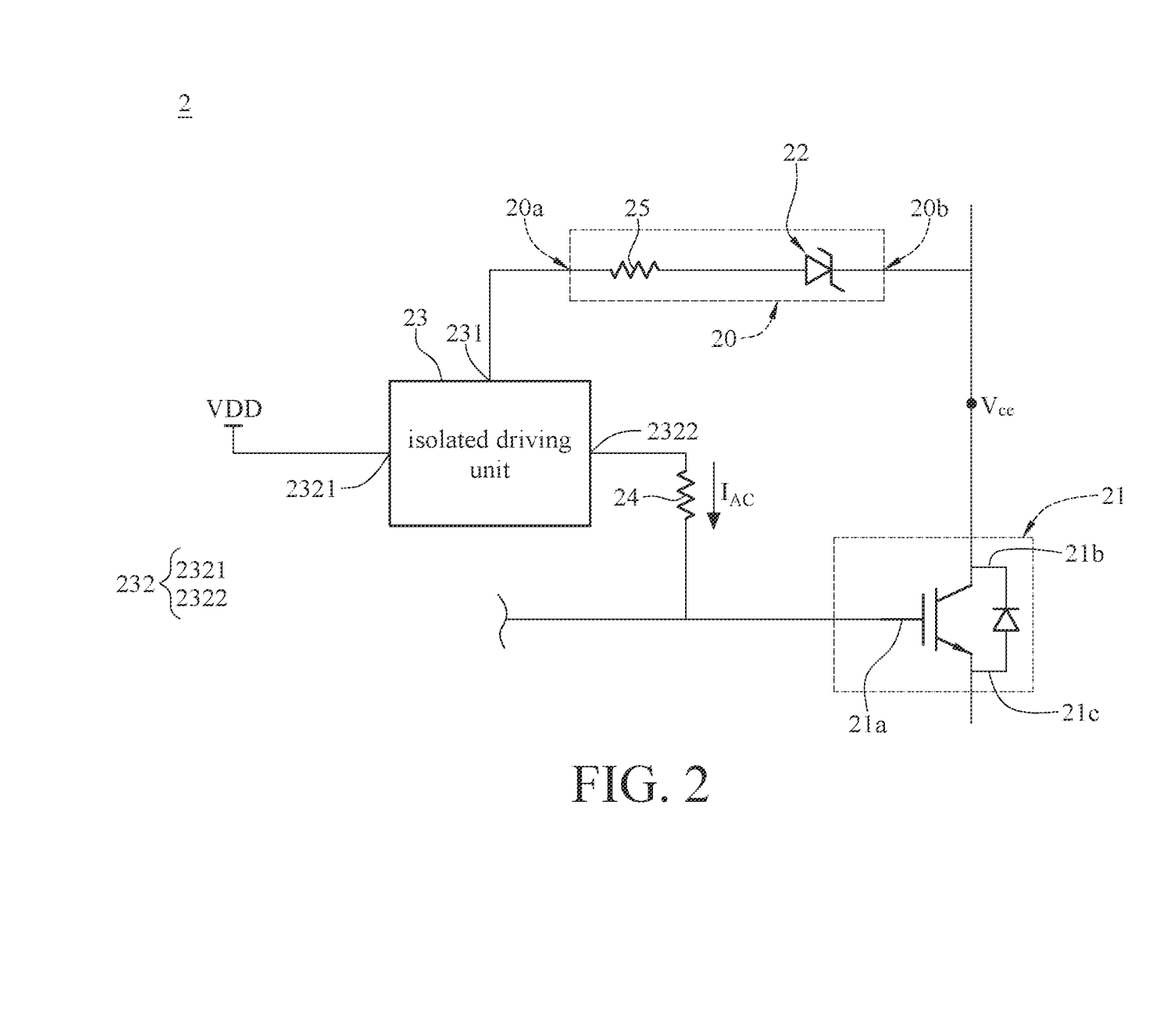
FIG. 2 is a circuit diagram illustrating a clamping circuit according to another embodiment of the present disclosure.

Please refer to FIG. 2, wherein FIG. 2 is a circuit diagram illustrating a clamping circuit according to another embodiment of the present disclosure. As shown in FIG. 2, the clamping circuit 2 includes a TVS diode module 20, an IGBT 21, an isolated driving unit 23 and a first current limiting resistor 24. The TVS diode module 20 includes a TVS diode 22 and a second current limiting resistor 25. The IGBT 21, the TVS diode 22 of the TVS diode module 20, the isolated driving unit 23 and the first current limiting resistor 24 are the same as the IGBT 11, the TVS diode 12 of the TVS diode module 10, the isolated driving unit 13 and the first current limiting resistor 14 shown in FIG. 1, respectively, so their descriptions are not repeated herein.

A terminal of the second current limiting resistor 25 (i.e., the first terminal 20a of the TVS diode module 20) is connected to a primary side 231 of the isolated driving unit 23, and the other terminal of the second current limiting resistor 25 is connected to an anode of the TVS diode 22. By disposing the second current limiting resistor 25, excessive current may be avoided from flowing into the primary side 231 of the isolated driving unit 23.

Figure 3:
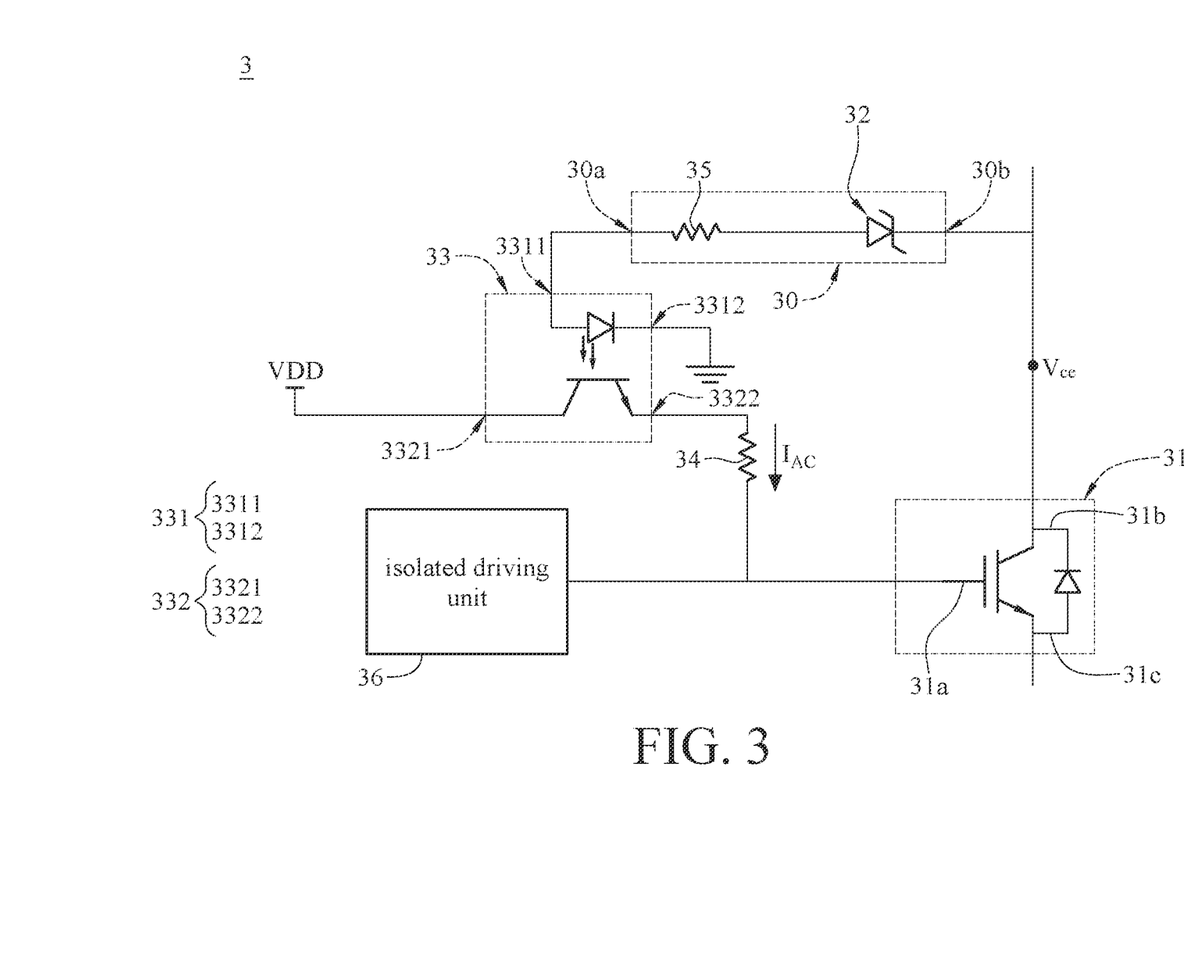
FIG. 3 is a circuit diagram illustrating a clamping circuit according to yet another embodiment of the present disclosure.

Please refer to FIG. 3, wherein FIG. 3 is a circuit diagram illustrating a clamping circuit according to yet another embodiment of the present disclosure. As shown in FIG. 3, the clamping circuit 3 includes a TVS diode module 30, an IGBT 31, an isolated driving unit 33, a first current limiting resistor 34 and a gate driving circuit 36. The TVS diode module 30 includes a TVS diode 32 and a second current limiting resistor 35. The IGBT 31 and the TVS diode 32 are the same as the IGBT 11 and the TVS diode 12 shown in FIG. 1, respectively; and the TVS diode module 30 and the first current limiting resistor 34 are the same as the TVS diode module 20 and the first current limiting resistor 24 shown in FIG. 2, respectively. In this embodiment, the isolated driving unit 33 is the optical coupler. It should be noted that in FIG. 3, the second current limiting resistor 35 is selectively disposed. In other words, although FIG. 3 shows the clamping circuit 3 including the first current limiting resistor 34 and the second current limiting resistor 35, the clamping circuit 3 may omit the second current limiting resistor 35 and only include the first current limiting resistor 34.

A primary side 331 of the isolated driving unit 33 includes a first terminal 3311 and a second terminal 3312, a secondary side 332 of the isolated driving unit 33 includes a first terminal 3321 and a second terminal 3322. The first terminal 3311 of the primary side 331 of the isolated driving unit 33 is connected to an anode of the TVS diode 32, and the second terminal 3312 of the primary side 331 of the isolated driving unit 33 is grounded. The first terminal 3321 of the secondary side 332 of the isolated driving unit 33 is connected to the first independent power source VDD, and the second terminal 3322 of the secondary side 332 of the isolated driving unit 33 is connected to a gate 31a of the IGBT 31. The gate driving circuit 36 is electrically connected to the gate 31a of the IGBT 31 and is configured to output driving voltage to the IGBT 31.

By using the optical coupler to implement the isolated driving unit 33, an overvoltage trigger signal may be accurately generated, and the overvoltage signal of the voltage Vce and the clamping current $I_{AC}$ may be processed separately, and the effect of amplifying the clamping current $I_{AC}$ may be provided at the same time.

Figure 4:
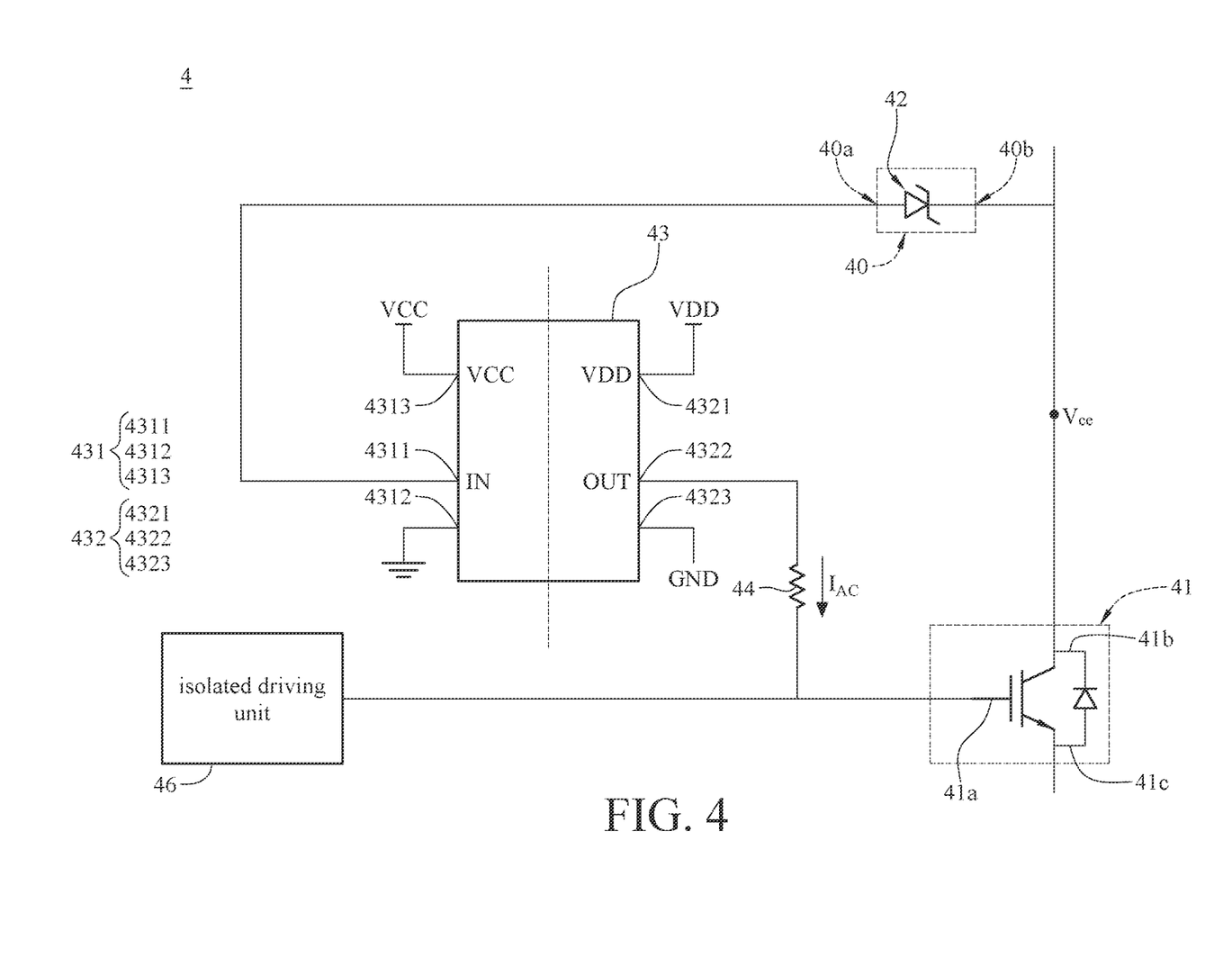
FIG. 4 is a circuit diagram illustrating a clamping circuit according to still another embodiment of the present disclosure.

FIG. 4 is a circuit diagram illustrating a clamping circuit according to still another embodiment of the present disclosure. As shown in FIG. 4, the clamping circuit 4 includes a TVS diode module 40, an IGBT 41, an isolated driving unit 43, a first current limiting resistor 44 and a gate driving circuit 46. The TVS diode module 40 includes a TVS diode 42. The TVS diode module 40 and the IGBT 41 are the same as the TVS diode module 10 and the IGBT 11 shown in FIG. 1, respectively; and the gate driving circuit 46 is the same as the gate driving circuit 36 shown in FIG. 3, so their descriptions are not repeated herein.

In this embodiment, the isolated driving unit 43 is the isolated gate driving chip and has a primary side 431 and a secondary side 432. The primary side 431 of the isolated driving unit 43 includes a first terminal 4311, a second terminal 4312 and a third terminal 4313. The first terminal 4311 of the primary side 431 is connected to a first terminal 40a of the TVS diode module 40, meaning an anode of the TVS diode 42. The second terminal 4312 of the primary side 431 is grounded. The third terminal 4313 of the primary side 431 is connected to a second independent power source VCC. The second independent power source VCC is configured to supply an operation voltage (for example, +5 volts) to the isolated driving unit 43, enabling the isolated driving unit 43 to operate when triggered. The secondary side 432 of the isolated driving unit 43 includes a first terminal 4321, a second terminal 4322 and a third terminal 4323. The first terminal 4321 of the secondary side 432 is configured to receive the power voltage from the first independent power source VDD. The second terminal 4322 of the secondary side 432 is connected to a terminal of the first current limiting resistor 44, and the third terminal 4323 of the secondary side 432 is grounded. The other terminal of the first current limiting resistor 44 is connected to a gate 41a of the IGBT 41.

Figure 5:
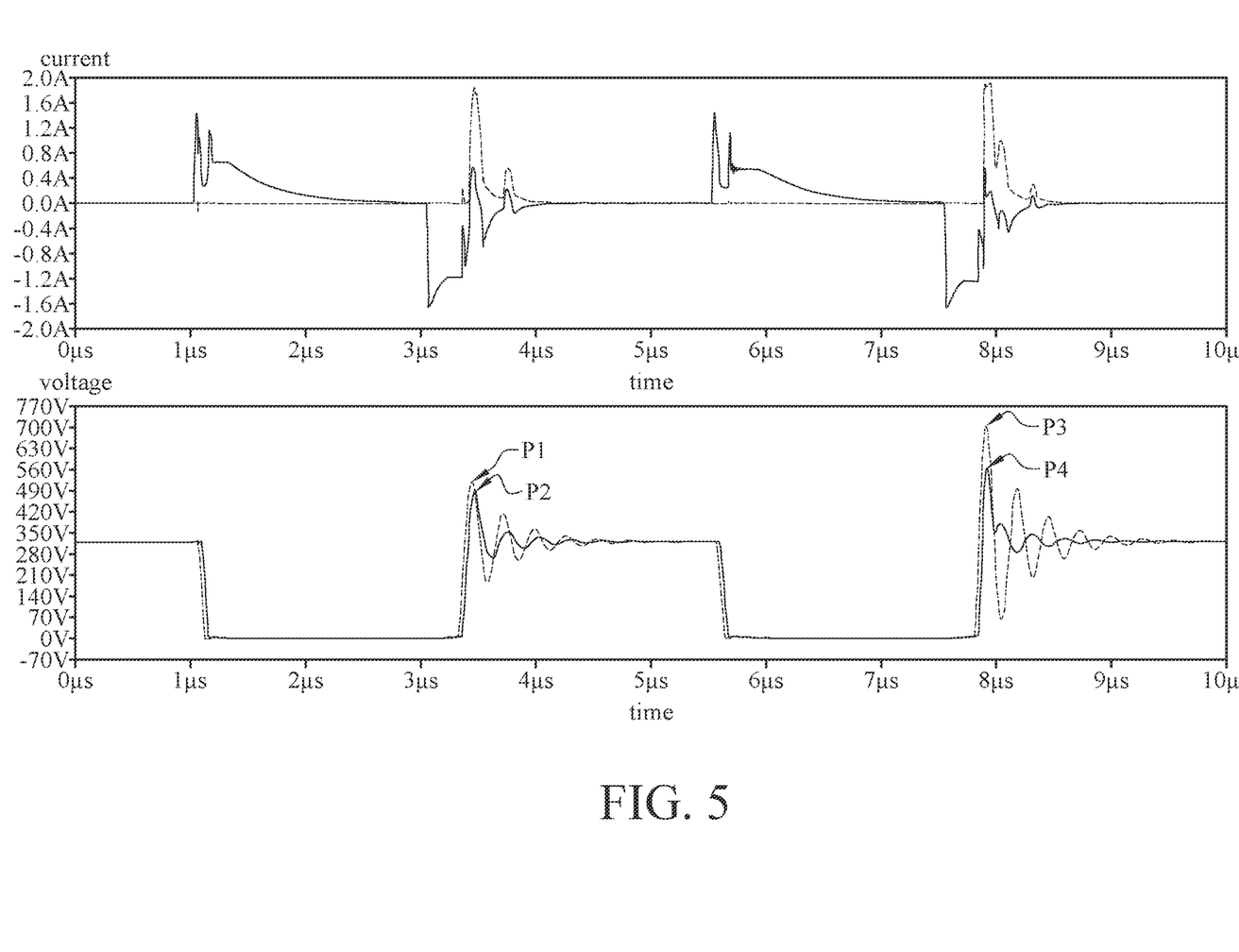
FIG. 5 is a graph showing the overvoltage clamping effect of the clamping circuit of the present disclosure.

Please refer to FIG. 5, wherein FIG. 5 is a graph showing the overvoltage clamping effect of the clamping circuit of the present disclosure. In FIG. 5, a double pulse is input to the gate of the IGBT. For the clamping current at the upper half of FIG. 5, the solid line is used to present the current of the gate of the IGBT, and the dotted line is used to present current output by the isolated driving unit (the clamping current). It can be seen in FIG. 5 that at the moment the IGBT is turned off, a clamping current is generated. For the voltage curves at the lower half of FIG. 5, the dotted line is used to present the original voltage Vce, and the solid line is used to present the voltage Vce that is clamped by the clamping circuit 4 shown in FIG. 4. As shown in FIG. 5, when the IGBT is turned off for the first time, the peak voltage P1 of the original voltage Vce is 520 volts, and the peak voltage P2 of the clamped voltage Vce is 488 volts. When the IGBT is turned off for the second time, the peak voltage P3 of the original voltage Vce is 703 volts, and the peak voltage P4 of the clamped voltage Vce is 565 volts. It can be seen in FIG. 5 that the clamping circuit of the present disclosure may effectively reduce the turn-off voltage of the IGBT, thereby alleviating the overvoltage situation.

Figure 6:
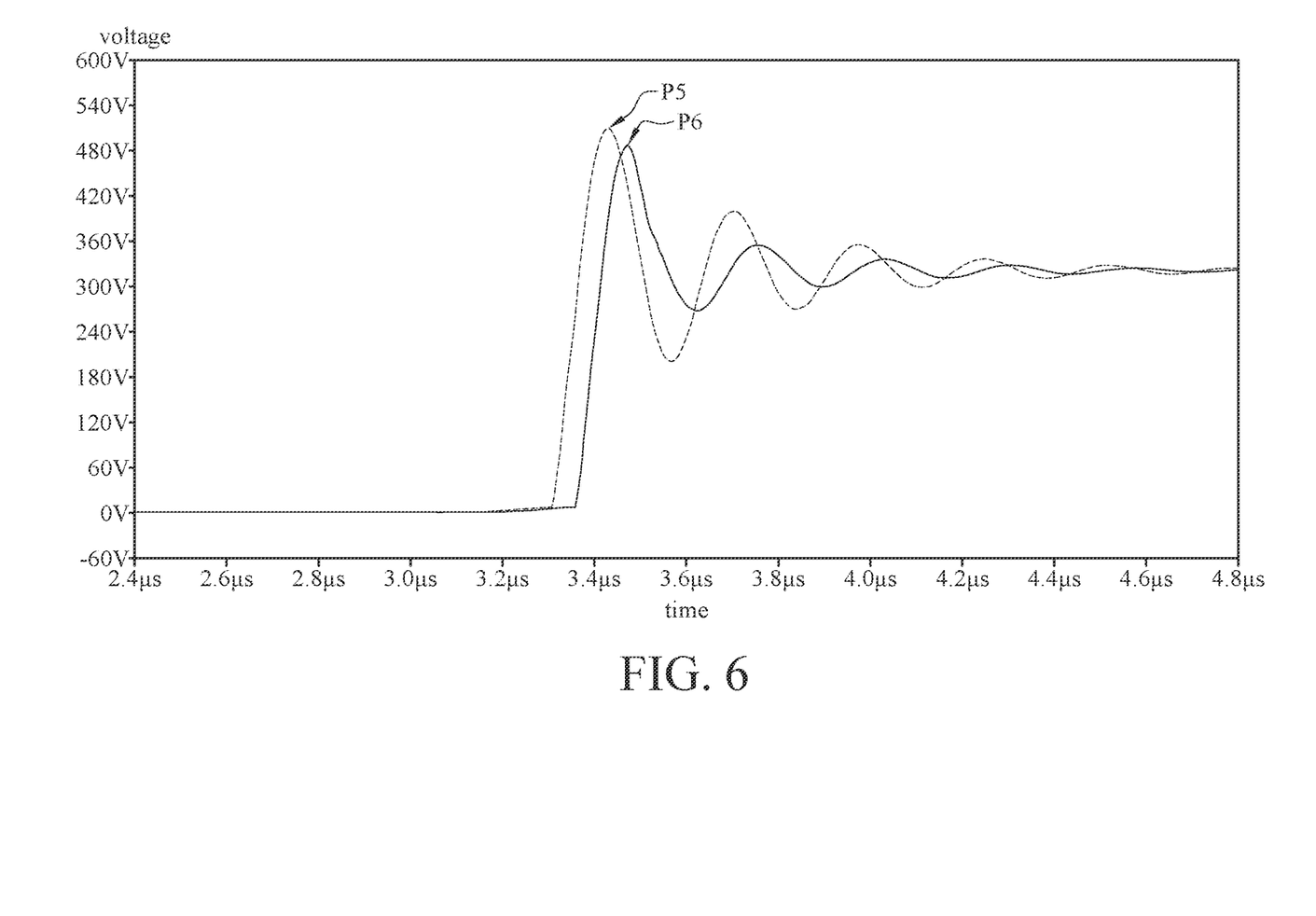
FIG. 6 is a graph showing a comparison between the overvoltage clamping effect of the clamping circuit of the present disclosure and the clamping circuit of prior art.

Please refer to FIG. 6, wherein FIG. 6 is a graph showing a comparison between the overvoltage clamping effect of the clamping circuit of the present disclosure and the clamping circuit of prior art. The dotted line is used to present the voltage Vce clamped by a clamping circuit of prior art (formed by a TVS diode and one diode), and the solid line is used to present the voltage Vce that is clamped by the clamping circuit 4 shown in FIG. 4. As shown in FIG. 6, the peak voltage P5 generated by the clamping circuit of prior art is 508 volts, and the peak voltage P6 generated by the clamping circuit of the present disclosure is 488 volts. It can be seen in FIG. 6 that the clamping circuit of the present disclosure may effectively reduce the peak voltage when the IGBT is turned off.

Figure 7:
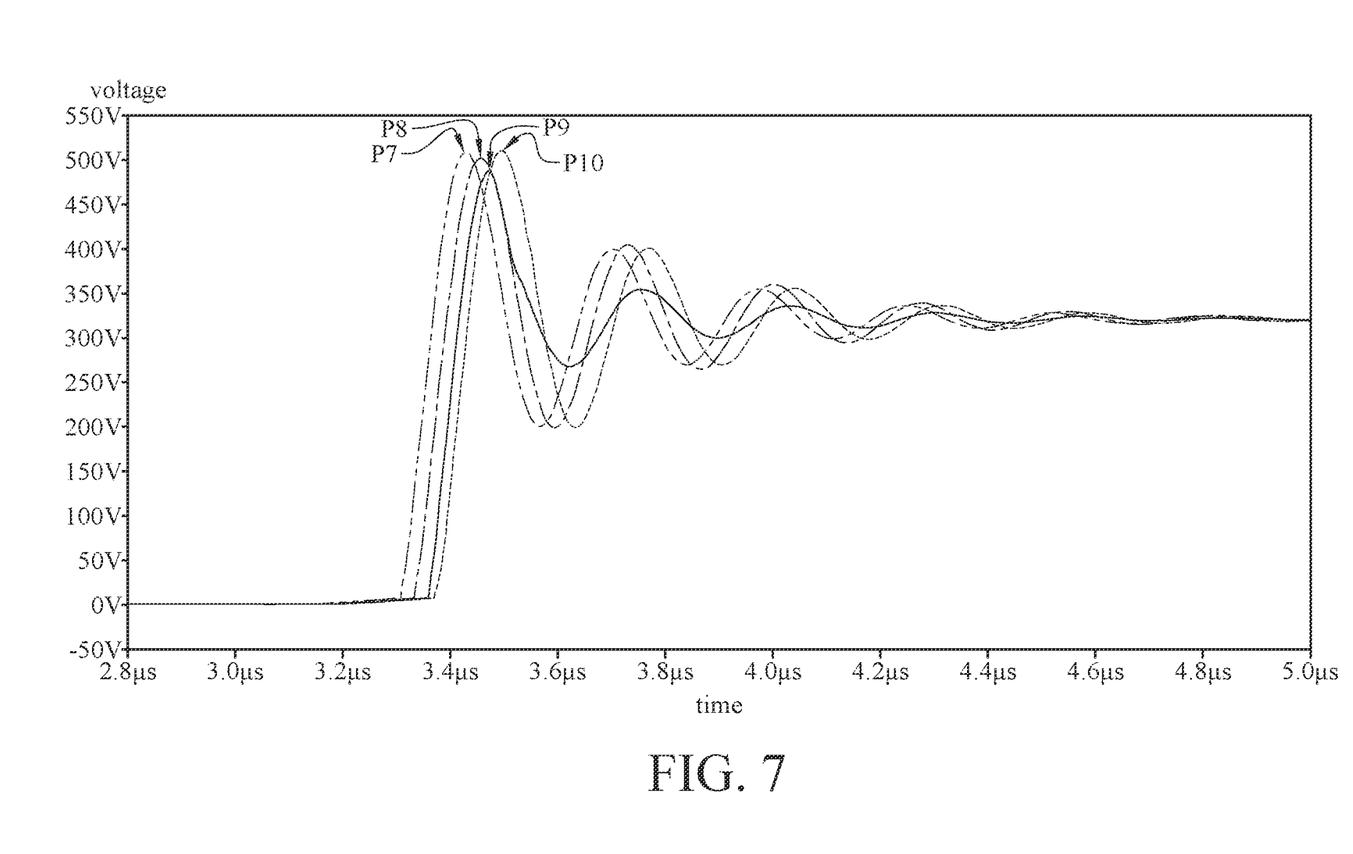
FIG. 7 is a graph showing comparisons between the overvoltage clamping effect of the clamping circuit of the present disclosure and the clamping circuits of prior arts.

Please refer to FIG. 7, wherein FIG. 7 is a graph showing comparisons between the overvoltage clamping effect of the clamping circuit of the present disclosure and the clamping circuits of prior arts. The dotted line where the peak voltage P7 located at is used to present the voltage Vce of the clamping circuit formed by one TVS diode and one diode (referred to as prior art 1), the dotted line where the peak voltage P8 located at is used to present the voltage Vce clamped by a metal-oxide-semiconductor field-effect transistor (referred to as prior art 2), the solid line where the peak voltage P9 located at is used to present the voltage Vce that is clamped by the clamping circuit 4 shown in FIG. 4, and the dotted line where the peak voltage P10 located at is used to present the voltage Vce where clamping is performed by one TVS diode (referred to as prior art 3).

As shown in FIG. 7, the peak voltage P7 generated by the clamping circuit of prior art 1 is 508 volts, the peak voltage P8 generated by the clamping circuit of prior art 2 is 502 volts, the peak voltage P10 generated by the clamping circuit of prior art 3 is 510 volts, and the peak voltage P9 generated by the clamping circuit of the present disclosure is 488 volts. In addition, comparing to using application-specific chip, the clamping circuit of the present disclosure may be implemented with a lower cost.

The clamping circuit described in one or more embodiments above may be applied to a driver of three-phase servo motor, but the present disclosure is not limited thereto.

In view of the above description, the clamping circuit according to one or more embodiments of the present disclosure may effectively reduce turn-off voltage and turn-off speed of the IGBT. In addition, comparing to using application-specific chip, the clamping circuit of the present disclosure may be implemented with a lower cost. By disposing the isolated driving unit as the optical coupler, an overvoltage trigger signal may be accurately generated, and the overvoltage signal and the clamping current may be processed separately, and the effect of amplifying the clamping current may be provided at the same time.

What is claimed is:

1. A clamping circuit, comprising:
   an insulated-gate bipolar transistor having a collector and a gate;
   a transient-voltage-suppression diode module having a first terminal and a second terminal, wherein the second terminal is connected to the collector of the insulated-gate bipolar transistor;
   an isolated driving unit having a primary side and a secondary side, wherein the primary side is connected to the first terminal of the transient-voltage-suppression diode module;
   a first independent power source configured to provide a power voltage to a first terminal of the secondary side of the isolated driving unit; and
   a first current limiting resistor, wherein a terminal of the first current limiting resistor is connected to a second terminal of the secondary side of the isolated driving unit, and the other terminal of the first current limiting resistor is connected to the gate of the insulated-gate bipolar transistor.

2. The clamping circuit according to claim 1, wherein the transient-voltage-suppression diode module comprises:
   a transient-voltage-suppression diode having an anode and a cathode, wherein the cathode is connected to the collector of the insulated-gate bipolar transistor; and
   a second current limiting resistor, wherein a terminal of the second current limiting resistor is connected to the primary side of the isolated driving unit, and the other terminal of the second current limiting resistor is connected to the anode of the transient-voltage-suppression diode.

3. The clamping circuit according to claim 1, further comprising:
   a gate driving circuit electrically connected to the gate of the insulated-gate bipolar transistor.

4. The clamping circuit according to claim 1, wherein the isolated driving unit is an optical coupler.

5. The clamping circuit according to claim 4, wherein a first terminal of the primary side of the isolated driving unit is connected to the first terminal of the transient-voltage-suppression diode module, and a second terminal of the primary side of the isolated driving unit is grounded.

6. The clamping circuit according to claim 1, wherein the isolated driving unit is an isolated gate driving chip.

7. The clamping circuit according to claim 6, wherein a first terminal of the primary side of the isolated driving unit is connected to the first terminal of the transient-voltage-suppression diode module, a second terminal of the primary side of the isolated driving unit is grounded, and a third terminal of the primary side of the isolated driving unit is connected to a second independent power source.

8. The clamping circuit according to claim 1, wherein the power voltage is equal to a driving voltage of the gate of the insulated-gate bipolar transistor.

* * * * *